US010381706B2

(12) United States Patent
Goto et al.

(10) Patent No.: US 10,381,706 B2
(45) Date of Patent: Aug. 13, 2019

(54) WILKINSON COMBINER AND WILKINSON DIVIDER

(71) Applicant: Hitachi Kokusai Electric Inc., Tokyo (JP)

(72) Inventors: Yusaburo Goto, Tokyo (JP); Keiichi Sakamaki, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/557,921

(22) PCT Filed: Mar. 23, 2015

(86) PCT No.: PCT/JP2015/058718
§ 371 (c)(1),
(2) Date: Sep. 13, 2017

(87) PCT Pub. No.: WO2016/151726
PCT Pub. Date: Sep. 29, 2016

(65) Prior Publication Data
US 2018/0053984 A1 Feb. 22, 2018

(51) Int. Cl.
*H01P 5/10* (2006.01)
*H01P 5/16* (2006.01)
*H01P 5/19* (2006.01)

(52) U.S. Cl.
CPC .............. *H01P 5/16* (2013.01); *H01P 5/10* (2013.01); *H01P 5/19* (2013.01); *H03F 2200/451* (2013.01)

(58) Field of Classification Search
CPC ...... H01P 5/12; H01P 5/16; H01P 5/10; H03F 2200/451
See application file for complete search history.

(56) References Cited

U.S. PATENT DOCUMENTS 5,021,755 A * 6/1991 Gustafson ................. H01P 5/16
333/128
5,206,611 A * 4/1993 Russell ..................... H01P 5/12
333/127

FOREIGN PATENT DOCUMENTS

| JP | 59-15057 Y2 | 5/1984 |
| JP | 59-148405 A | 8/1984 |
| JP | 59-176903 A | 10/1984 |
| JP | 11-112362 A | 4/1999 |
| JP | 2000-183665 A | 6/2000 |
| JP | 2012-054852 A | 3/2012 |
| WO | 2014/078334 A | 5/2014 |

OTHER PUBLICATIONS

International Search Report of PCT/JP2015/058718 dated May 12, 2015.

* cited by examiner

*Primary Examiner* — Robert J Pascal
*Assistant Examiner* — Kimberly E Glenn
(74) *Attorney, Agent, or Firm* — Mattingly & Malur, PC (57) ABSTRACT

A Wilkinson combiner includes: a plurality of splitting units that splits signals inputted from two ports; an isolating unit that connects one ends of the signals split at the plurality of splitting units to each other; and a combiner that connects other ends of the signals split at the plurality of splitting units to each other and outputs a combined signal. The isolating unit balun-connects the connected signals to each other using a balun circuit, short-circuits the balun-connected one end, and terminates the balun-connected other end using a terminator.

8 Claims, 11 Drawing Sheets

WILKINSON COMBINER AND WILKINSON DIVIDER

TECHNICAL FIELD

The present disclosure relates to a Wilkinson combiner and a Wilkinson divider, which are applicable to a high power Wilkinson combiner and a Wilkinson divider, for example.

BACKGROUND ART

The Wilkinson combiner and the Wilkinson divider are often used for combining and dividing power in radio frequency amplification, for example.

CITATION LIST

Patent Literature

Patent Literature 1: Japanese Unexamined Patent Application Publication No. 2012-54852
Patent Literature 2: Japanese Unexamined Patent Application Publication No. 2000-183665
Patent Literature 3: Japanese Unexamined Patent Application Publication No. Hei 11(1999)-112362

SUMMARY OF INVENTION

Technical Problem

An object of the present disclosure is to provide a technique suitable for a high power Wilkinson combiner and a Wilkinson divider.

Solution to Problem

The following is the brief description of representative aspects of the present disclosure.
(1) A Wilkinson combiner includes: a plurality of splitting units that splits signals inputted from two ports; an isolating unit that connects one ends of the signals split at the plurality of splitting units to each other; and a combiner that connects other ends of the signals split at the plurality of splitting units to each other and outputs a combined signal. The isolating unit balun-connects the connected signals to each other using a balun circuit, short-circuits the balun-connected one end, and terminates the balun-connected other end using a terminator.
(2) A Wilkinson divider includes: a divider that divides an inputted signal; a plurality of splitting units that splits signals divided at the divider and outputs one ends of the signals; and an isolating unit that connects other ends of the signals split at the plurality of splitting units to each other. The isolating unit balun-connects the connected signals to each other using a balun circuit, short-circuits the balun-connected one end, and terminates the balun-connected other end using a terminator.

Advantageous Effects of Invention

According to the Wilkinson combiner and the Wilkinson divider, the degradation of the characteristics can be reduced while being high power.

DESCRIPTION OF EMBODIMENTS

In the following, embodiments and examples will be described with reference to the drawings. However, in the following description, the same components are designated with the same reference signs, and a duplicate description is sometimes omitted.

Figure 1:
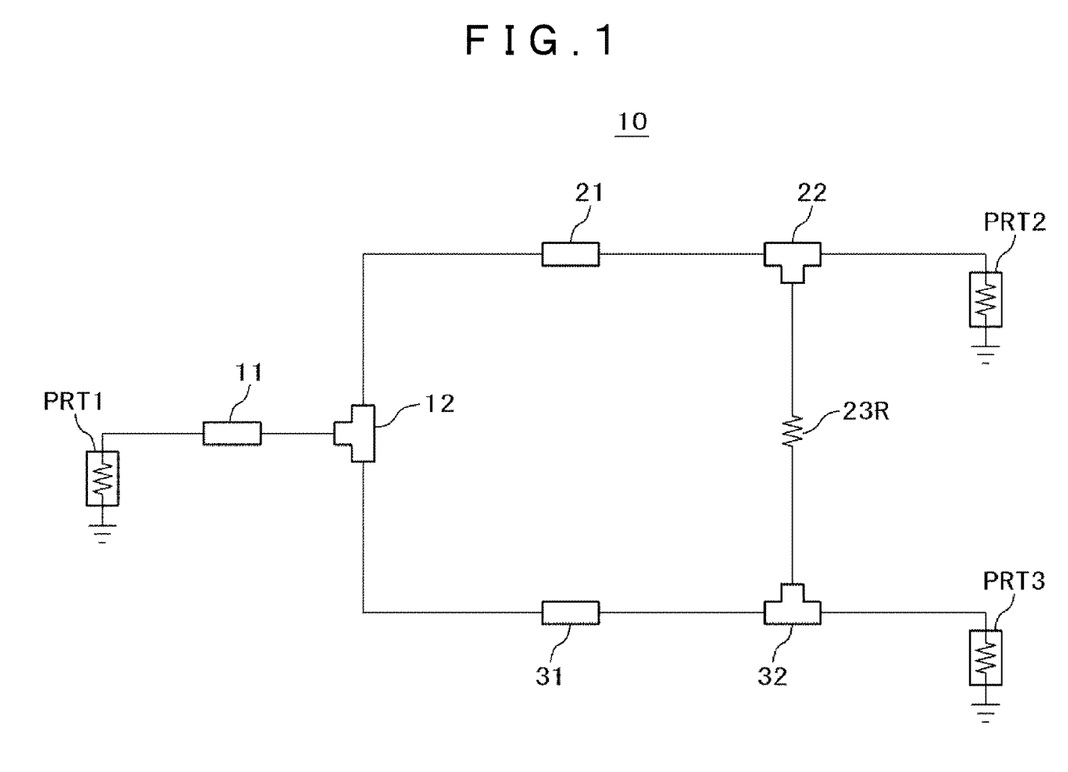
FIG. 1 is a diagram for illustrating the configuration of a Wilkinson combiner according to a comparative example.

First, a Wilkinson combiner according to a technique investigated prior to the present disclosure will be described with reference to FIG. 1 (in the following, the technique is referred to as a comparative example). FIG. 1 is a diagram of the configuration of a Wilkinson combiner according to the comparative example.

A Wilkinson combiner 10 according to the comparative example is a combiner that combines two inputs in a 50-ohm system. The Wilkinson combiner 10 includes a splitter 22 that is a splitting unit, a matching circuit 21, a splitter 32 that is a splitting unit, a matching circuit 31, an isolating unit 23R, a combiner 12, and a matching circuit 11. For example, the matching circuits 21 and 31 are quarter wave transmission lines with an impedance of 70.7 ohms, and the matching circuit 11 is a 50-ohm transmission line. In the configuration of FIG. 1, when a port PRT2 and a port PRT3 are provided with inputs in the same amplitude and the same phase, a port PRT1 outputs a combined output. The isolating unit 23R disposed between the splitters 22 and 32 is a 100-ohm resistor, which is referred to as an isolation resistor and necessary to provide isolation between the ports PRT2 and PRT3.

When an amplitude different and a phase difference are present between the input of the port PRT2 and the input of the port PRT3, these differences becomes a combined loss, which is absorbed into the isolation resistor. In the case in which input power to the isolation resistor is the maximum, this is the case in which no input is provided to the port PRT2 or the port PRT3. In this case, a half of the input is absorbed into the isolation resistor. For example, in the case in which a 100-watt input is provided to the port PRT2 and no input is provided to the port PRT3, the power of 100 watts inputted from the port PRT2 is split at the splitter 22, the power of 50 watts is outputted to the port PRT1, and the power of 50 watts is absorbed into the isolation resistor.

When the isolation resistor has normal rated power, which is not sufficiently large, this might damage the isolation resistor with a combined loss. In this case, the Wilkinson combiner is entirely affected by this combined loss. In order to protect the Wilkinson combiner or to prevent secondary damage, it is necessary to select an isolation resistor having normal rated power with the maximum load plus some margin.

From the description above, when the output of the Wilkinson combiner is increased, it is necessary to select an isolation resistor having a large normal rated power suitable for the increased output. However, when the normal rated power of the isolation resistor is increased, the parasitic component of the isolation resistor is increased correspondingly. In the case in which the normal rated power of the isolation resistor is small to some extent, the parasitic component is ignorable. However, when the normal rated power is increased to some extent, the influence of the parasitic component becomes an unignorable level, greatly degrading the characteristics of the Wilkinson combiner.

Figure 2:
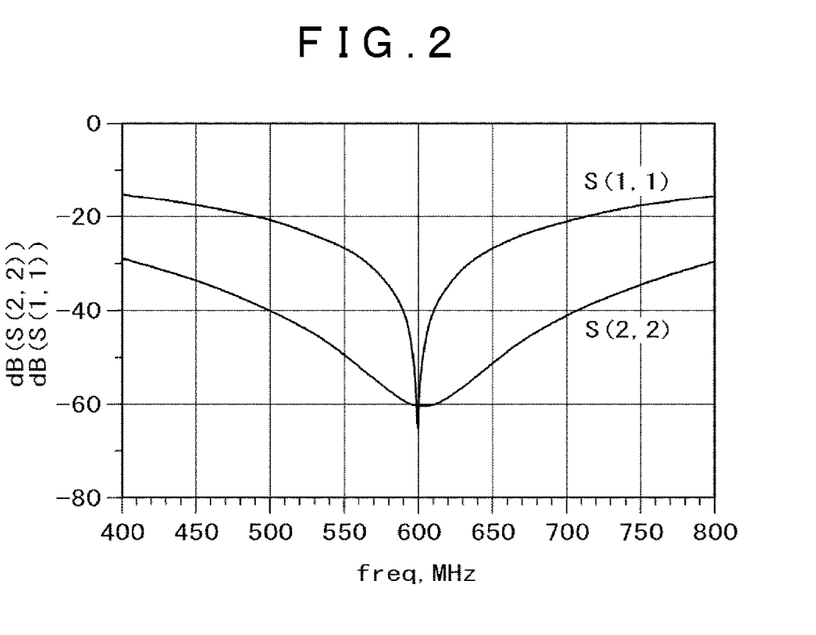
FIG. 2 is a diagram for illustrating the simulation result of the reflection characteristics in the case of using an ideal resistor for an isolation resistor.
Figure 3:
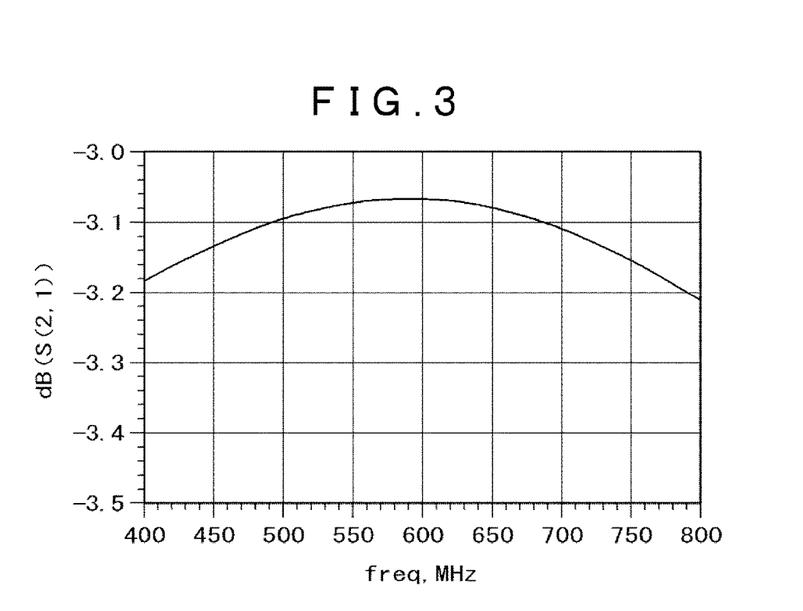
FIG. 3 is a diagram for illustrating the simulation result of transmission losses in the case of using an ideal resistor for an isolation resistor.
Figure 4:
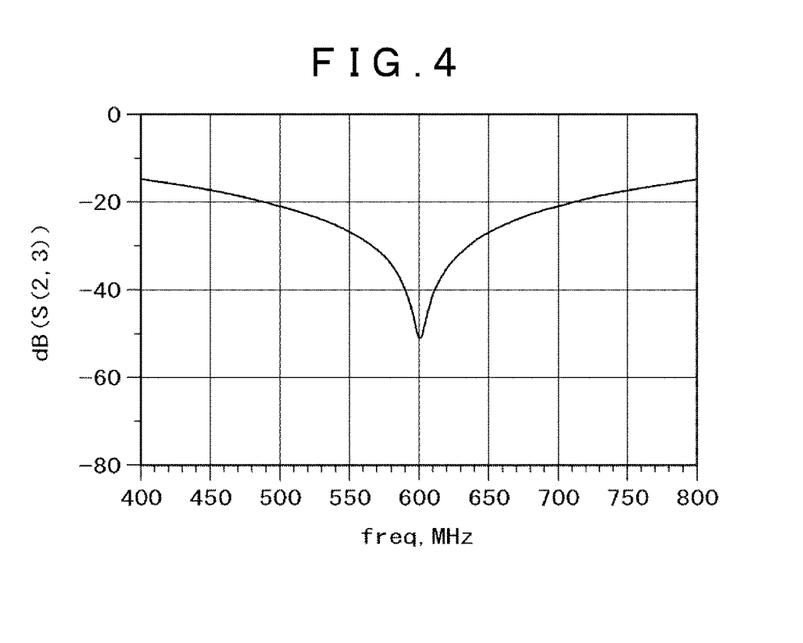
FIG. 4 is a diagram for illustrating the simulation result of the isolation characteristics in the case of using an ideal resistor for an isolation resistor.

Next, referring to FIGS. 2 to 4, the characteristics in the case of using an ideal resistor for the isolation resistor of the Wilkinson combiner 10 having the band adjusted to a band of 500 to 700 MHz will be described. FIG. 2 is a diagram of the simulation result of the reflection characteristics in the case of using an ideal resistor for the isolation resistor. Note that, FIG. 2 shows the reflection characteristic (S (2, 2)) of the port PRT2. However, the characteristics viewed from the port PRT3 are also equivalent to the characteristics of the circuit viewed from the port PRT2, and these characteristics are theoretically matched with each other. Thus, in FIG. 2 for illustrating the simulation result, the reflection characteristic (S (3, 3)) of the port PRT3 is omitted, and the description is also omitted. FIG. 3 is a diagram of the simulation result of transmission losses in the case of using an ideal resistor for the isolation resistor. Note that, FIG. 3 shows the transmission loss (S (2, 1)) between the ports PRT2 and PRT1. However, the characteristics viewed from the port PRT3 are also equivalent to the characteristics of the circuit viewed from the port PRT2, and these characteristics are theoretically matched with each other. Thus, in FIG. 3 for illustrating the simulation result, the transmission loss (S (3, 1)) between the ports PRT3 and PRT1 is omitted, and the description is also omitted. FIG. 4 is a diagram of the simulation result of the isolation characteristics in the case of using an ideal resistor for the isolation resistor.

As shown in FIG. 2, the reflection characteristic (S (1, 1)) of the port PRT1 in a band of 500 MHz is about −21 dB, S (1, 1) in a band of 600 MHz is about −66 dB, and S (1, 1) in a band of 700 MHz is about −21 dB. The reflection characteristic (S (2, 2)) of the port PRT2 in a band of 500 MHz is about −40 dB, S (2, 2) in a band of 600 MHz is about −60 dB, and S (2, 2) in a band of 700 MHz is about −41 dB. As described above, the reflection characteristics of the port PRT1 and the port PRT2 are excellent.

As shown in FIG. 3, the transmission loss (S (2, 1)) between the ports PRT2 and PRT1 in a band of 500 MHz is about −3.1 dB, S (2, 1) in a band of 600 MHz is about −3.1 dB, and S (2, 1) in a band of 700 MHz is about −3.1 dB. As described above, the transmission losses are excellent.

As shown in FIG. 4, the isolation characteristic (S (2, 3)) between the ports PRT2 and PRT3 in a band of 500 MHz is about −21 dB, S (2, 3) in a band of 600 MHz is about −51 dB, and S (2, 3) in a band of 700 MHz is about −21 dB. As described above, the isolation characteristics are excellent.

Figure 5:
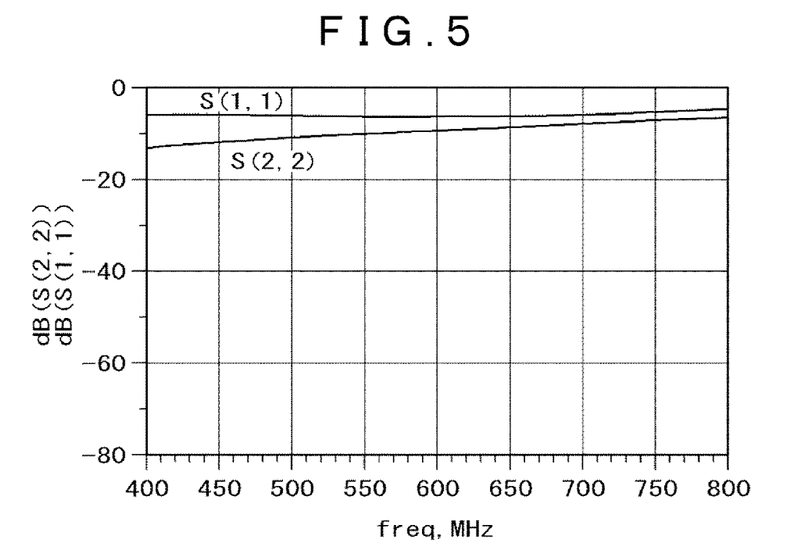
FIG. 5 is a diagram for illustrating the simulation result of the reflection characteristics in the case of using a high power withstanding resistor for an isolation resistor.
Figure 6:
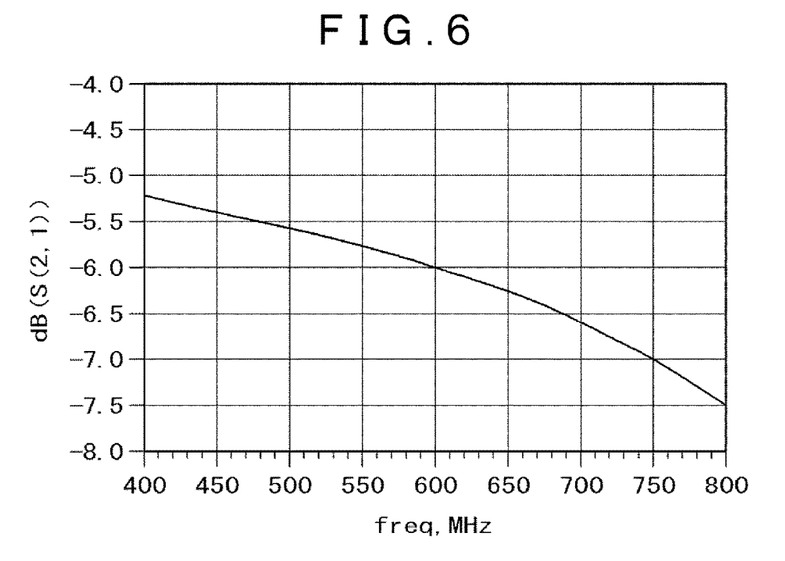
FIG. 6 is a diagram for illustrating the simulation result of transmission losses in the case of using a high power withstanding resistor for an isolation resistor.
Figure 7:
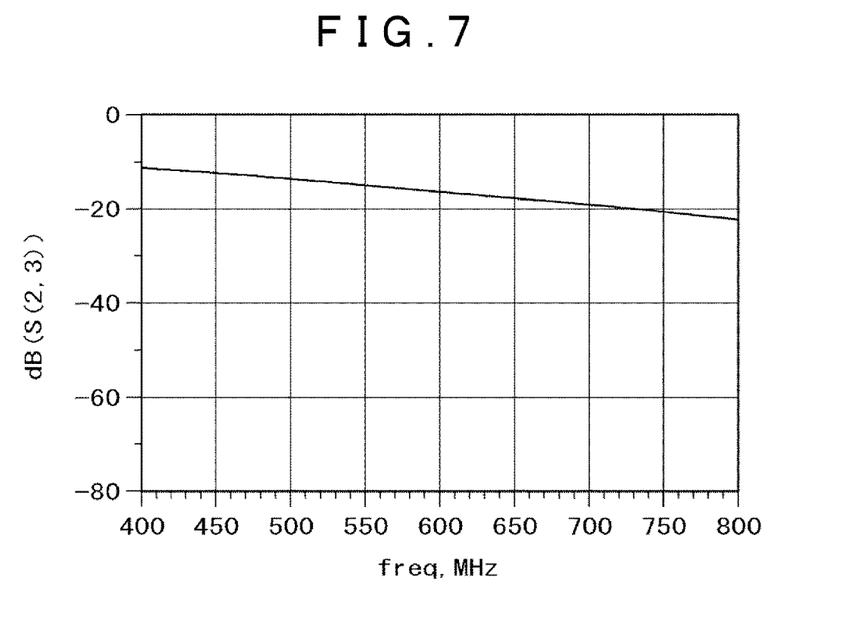
FIG. 7 is a diagram for illustrating the simulation result of the isolation characteristics in the case of using a high power withstanding resistor for an isolation resistor.

Next, referring to FIGS. 5 to 7, the characteristics in the case of using a resistor (a high power withstanding resistor) with a large normal rated power for the isolation resistor of the Wilkinson combiner 10 having the band adjusted to a band of 500 to 700 MHz will be described. FIG. 5 is a diagram of the simulation result of the reflection characteristics in the case of using a high power withstanding resistor for the isolation resistor. Note that, FIG. 5 shows the reflection characteristic (S (2, 2)) of the port PRT2. However, the characteristics viewed from the port PRT3 are also equivalent to the characteristics of the circuit viewed from the port PRT2, and these characteristics are theoretically matched with each other. Thus, in FIG. 5 for illustrating the simulation result, the reflection characteristic (S (3, 3)) of the port PRT3 is omitted, and the description is also omitted. FIG. 6 is a diagram of the simulation result of transmission losses in the case of using a high power withstanding resistor for the isolation resistor. Note that, FIG. 6 shows the transmission loss (S (2, 1)) between the ports PRT2 and PRT1. However, the characteristics viewed from the port PRT3 are also equivalent to the characteristics of the circuit viewed from the port PRT2, and these characteristics are theoretically matched with each other. Thus, in FIG. 6 for illustrating the simulation result, the transmission loss (S (3, 1)) between the ports PRT3 and PRT1 is omitted, and the description is also omitted. FIG. 7 is a diagram of the simulation result of the isolation characteristics in the case of using a high power withstanding resistor for the isolation resistor.

As shown in FIG. 5, the reflection characteristic (S (1, 1)) of the port PRT1 in a band of 500 MHz is about −6.2 dB, S (1, 1) in a band of 600 MHz is about −6.4 dB, and S (1, 1) in a band of 700 MHz is about −6.0 dB. The reflection characteristic of the port PRT2 in a band of 500 MHz is about −11 dB, S (2, 2) in a band of 600 MHz is about −9.4 dB, and the reflection characteristic (S (2, 2)) in a band of 700 MHz is about −8.1 dB. As described above, the reflection characteristics are considerably degraded, compared with the case of using an ideal resistor for the isolation resistor (FIG. 2).

As shown in FIG. 6, the transmission loss (S (2, 1)) between the ports PRT2 and PRT1 in a band of 500 MHz is about −5.6 dB, S (2, 1) in a band of 600 MHz is about −6.0 dB, and S (2, 1) in a band of 700 MHz is about −6.6 dB. As described above, the transmission losses are considerably degraded, compared with the case of using an ideal resistor for the isolation resistor (FIG. 3).

As shown in FIG. 7, the isolation characteristic (S (2, 3)) between the ports PRT2 and PRT3 in a band of 500 MHz is about −14 dB, S (2, 3) in a band of 600 MHz is about −16 dB, and S (2, 3) in a band of 700 MHz is about −19 dB.

As described above, the use of an isolation resistor with a large normal rated power adversely affects the characteristics, which makes it difficult to implement a high power Wilkinson divider and combiner.

Embodiments

A Wilkinson combiner according to an embodiment includes: a first splitting unit that splits a signal inputted from a second port; a second splitting unit that splits a signal inputted from a third port; an isolating unit that connects one end of the signal split at the first splitting unit to one end of the signal split at the second splitting unit; and a combiner that connects the other end of the signal split at the first splitting unit to the other end of the signal split at the second splitting unit and outputs a combined signal to the first port. The isolating unit balun-connects a signal from the one end of the signal split at the first splitting unit to a signal from the one end of the signal split at the second splitting unit using a balun circuit, short-circuits the balun-connected one end, and terminates the balun-connected other end using a terminator.

A Wilkinson divider according to another embodiment includes: a divider that divides a signal inputted from a first port; a first splitting unit that splits the signal divided at the divider and outputs one end of the split signal to a second port; a second splitting unit that splits the signal divided at the divider and outputs one end of the split signal to a third port; and an isolating unit that connects the other ends of the signals split at the first splitting unit and the second splitting unit to each other. The isolating unit balun-connects a signal from the one end of the signal split at the first splitting unit to a signal from the one end of the signal split at the second splitting unit using a balun circuit, short-circuits the balun-connected one end, and terminates the balun-connected other end using a terminator.

According to the embodiments, the characteristics (the reflection characteristics, transmission losses, and the isolation characteristics) can be brought close to the characteristics when the isolation resistor is an ideal resistor. Thus, the Wilkinson combiner and the Wilkinson divider having high withstand power at the isolating unit can be achieved.

Example 1

Figure 8:
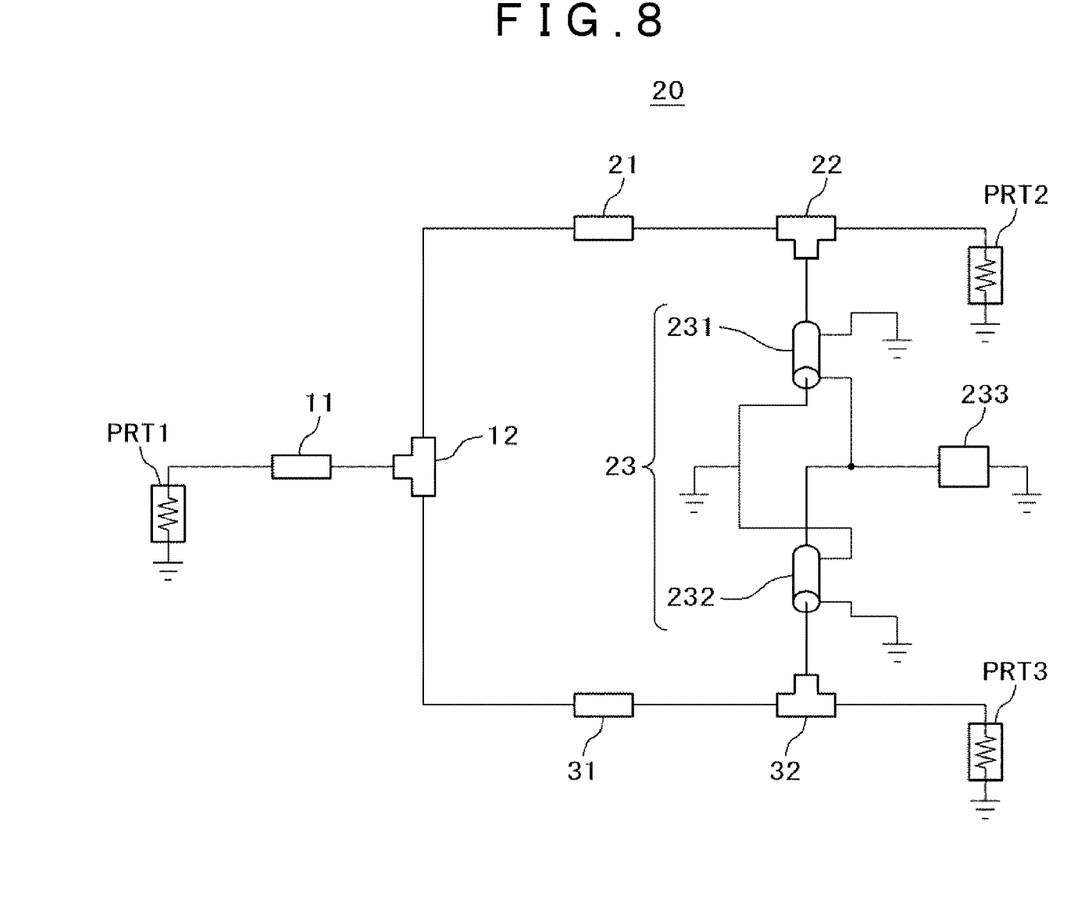
FIG. 8 is a diagram for illustrating the configuration of a Wilkinson combiner according to example 1.
Figure 9:
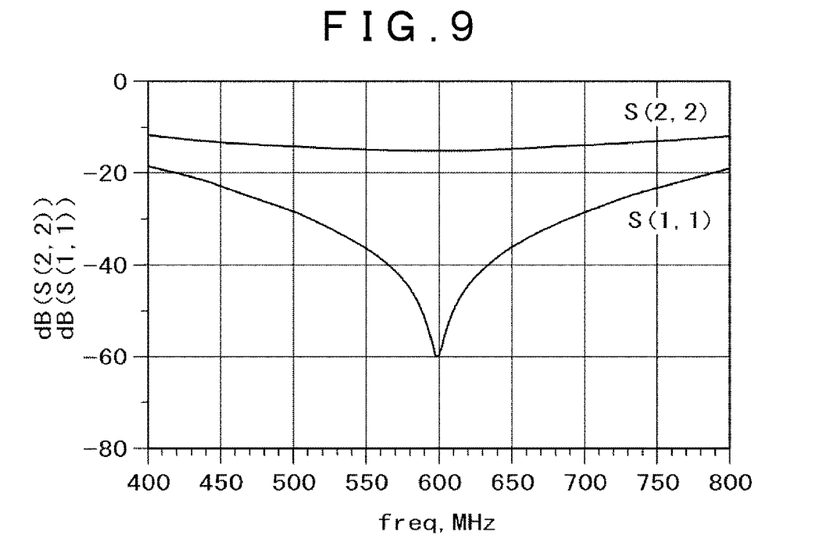
FIG. 9 is a diagram for illustrating the simulation result of the reflection characteristics of the Wilkinson combiner according to example 1.
Figure 10:
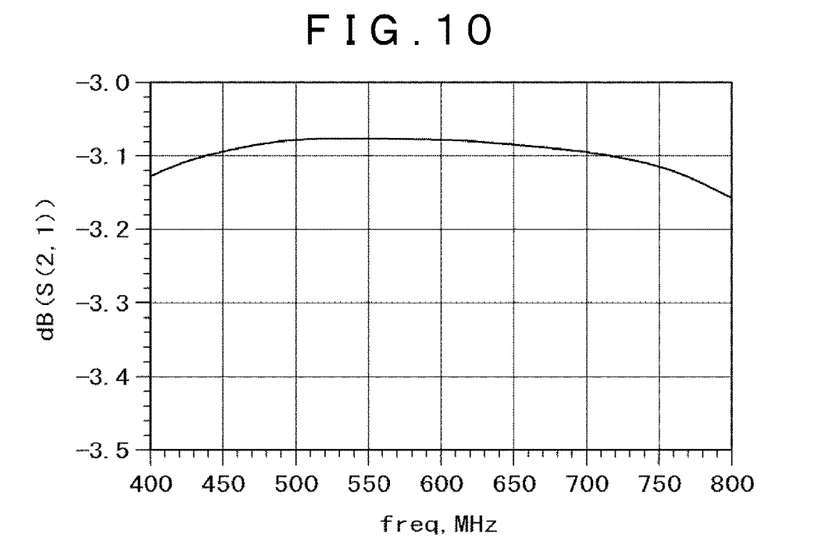
FIG. 10 is a diagram for illustrating the simulation result of transmission losses of the Wilkinson combiner according to example 1.
Figure 11:
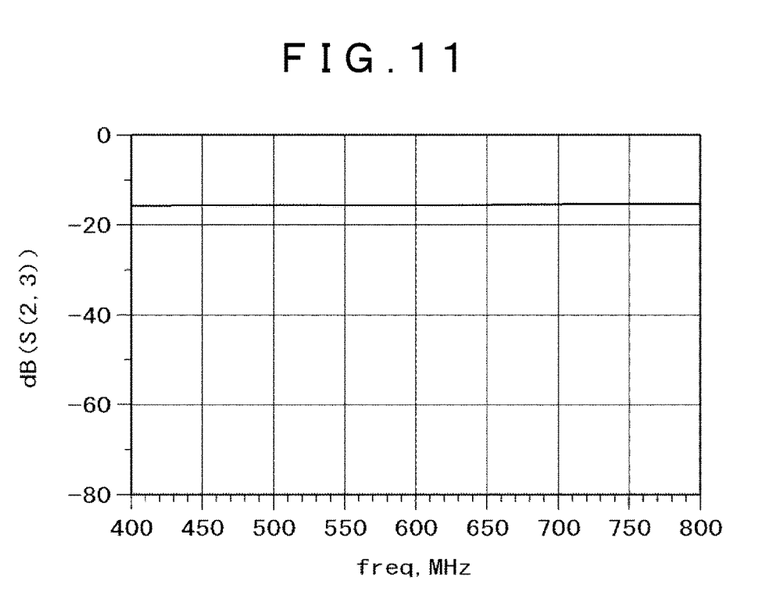
FIG. 11 is a diagram for illustrating the simulation result of the isolation characteristics of the Wilkinson combiner according to example 1.

A Wilkinson combiner according to example 1 will be described with reference to FIGS. 8 to 11. FIG. 8 is a diagram of the configuration of the Wilkinson combiner according to example 1. FIG. 9 is a diagram of the simulation result of the reflection characteristics of the Wilkinson combiner according to example 1. Note that, FIG. 9 shows the reflection characteristic (S (2, 2)) of the port PRT2. However, the characteristics viewed from the port PRT3 are also equivalent to the characteristics of the circuit viewed from the port PRT2, and these characteristics are theoretically matched with each other. Thus, in FIG. 9 for illustrating the simulation result, the reflection characteristic (S (3, 3)) of the port PRT3 is omitted, and the description is also omitted. FIG. 10 is a diagram of the simulation result of transmission losses in the Wilkinson combiner according to example 1. Note that, FIG. 10 shows the transmission loss (S (2, 1)) between the ports PRT2 and PRT1. However, the characteristics viewed from the port PRT3 are also equivalent to the characteristics of the circuit viewed from the port PRT2, and these characteristics are theoretically matched with each other. Thus, in FIG. 10 for illustrating the simulation result, the transmission loss (S (3, 1)) between the ports PRT3 and PRT1 is omitted, and the description is also omitted. FIG. 11 is a diagram of the simulation result of the isolation characteristics of the Wilkinson combiner according to example 1.

The Wilkinson combiner 20 according to example 1 has the same configuration as the configuration of the Wilkinson combiner 10 except an isolating unit 23. Note that, the matching circuits 11, 21, and 31 are provided as necessary. The isolating unit 23 balun-connects semi-rigid cables 231 and 232 to each other, short-circuits one end, and connects the other end to a termination resistor 233, which is a terminator. That is, one end of the inner conductor of the semi-rigid cable 231 is connected to the splitter 22, and the other end of the inner conductor of the semi-rigid cable 231 is grounded. One end of the outer conductor of the semi-rigid cable 231 is grounded, and the other end of the outer conductor of the semi-rigid cable 231 is connected to one end of the inner conductor of the semi-rigid cable 232 and to the termination resistor 233, which is a terminator. The other end of the inner conductor of the semi-rigid cable 232 is connected to the splitter 32, and one end and the other end of the outer conductor of the semi-rigid cable 232 are separately grounded. The semi-rigid cables 231 and 232 are transmission lines of one-quarter wavelength (600 MHz) with an impedance of 100 ohms. The termination resistor 233 is a 50-ohm resistor having a large normal rated power. Note that, the semi-rigid cable is a coaxial cable that is easily bendable into a shape finally used and maintains the shape after bent.

As shown in FIG. 9, the reflection characteristic (S (1, 1)) of the port PRT1 in a band of 500 MHz is about −29 dB, S (1, 1) in a band of 600 MHz is about −59 dB, and S (1, 1) in a band of 700 MHz is about −29 dB. The reflection characteristic (S (2, 2)) of the port PRT2 in a band of 500 MHz is about −14 dB, S (2, 2) in a band of 600 MHz is about −15 dB, and S (2, 2) in a band of 700 MHz is about −14 dB. As described above, the reflection characteristics of the port PRT1 are equivalent to ones in the case of using an ideal resistor for the isolation resistor (FIG. 2), which are excellent. Note that, the reflection characteristics of the port PRT2 are the reflection characteristics more excellent than in the case of using an isolation resistor with a large normal rated power (FIG. 5).

As shown in FIG. 10, the transmission loss (S (2, 1)) between the ports PRT2 and PRT1 in a band of 500 MHz is about −3.1 dB, S (2, 1) in a band of 600 MHz is about −3.1 dB, and S (2, 1) in a band of 700 MHz is about −3.1 dB. As described above, the transmission losses are equivalent to ones in the case of using an ideal resistor for the isolation resistor (FIG. 3).

As shown in FIG. 11, the isolation characteristic (S (2, 3)) between the ports PRT2 and PRT3 in a band of 500 MHz is about −16 dB, S (2, 3) in a band of 600 MHz is about −15 dB, and S (2, 3) in a band of 700 MHz is about −15 dB.

When an isolation resistor with a large normal rated power was used, the parasitic component of the isolation resistor was affected. However, since the isolating unit is configured as the configuration of example 1, the influence of the parasitic component of the resistor can be reduced, and the characteristics are provided, which are closer to the characteristics in the case of using an ideal resistor than in the case of using an isolation resistor with a large normal rated power. Thus, the Wilkinson combiner having a high withstand power at the isolating unit can be achieved.

Example 2

Figure 12:
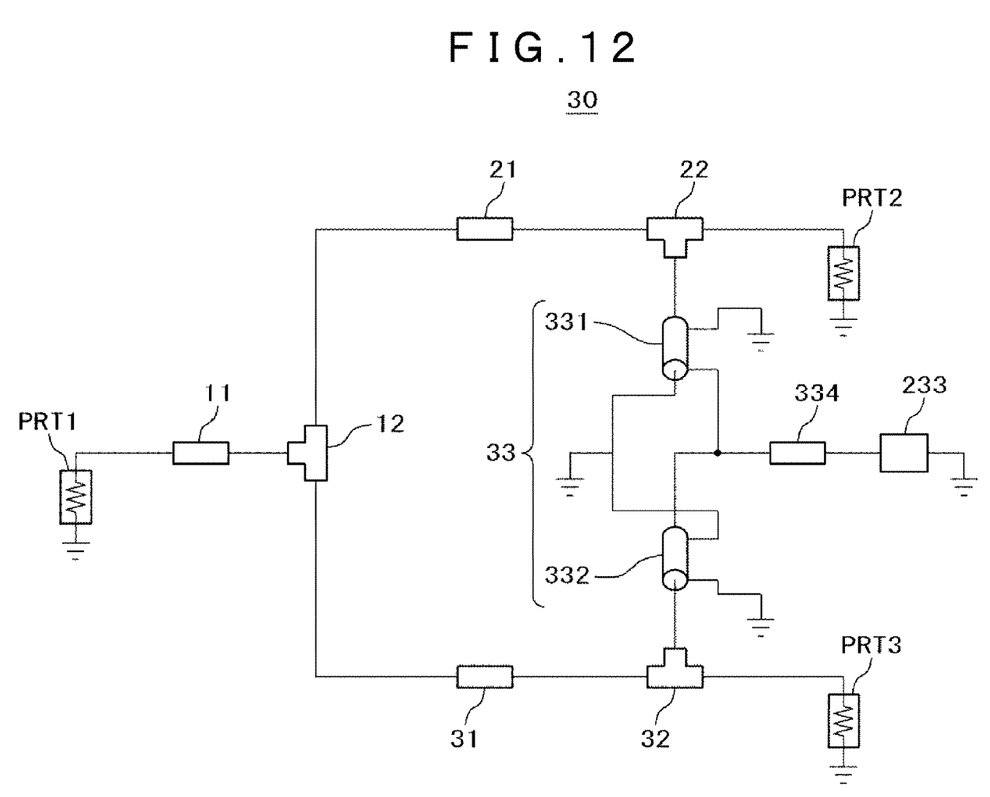
FIG. 12 is a diagram for illustrating the configuration of a Wilkinson combiner according to example 2.
Figure 13:
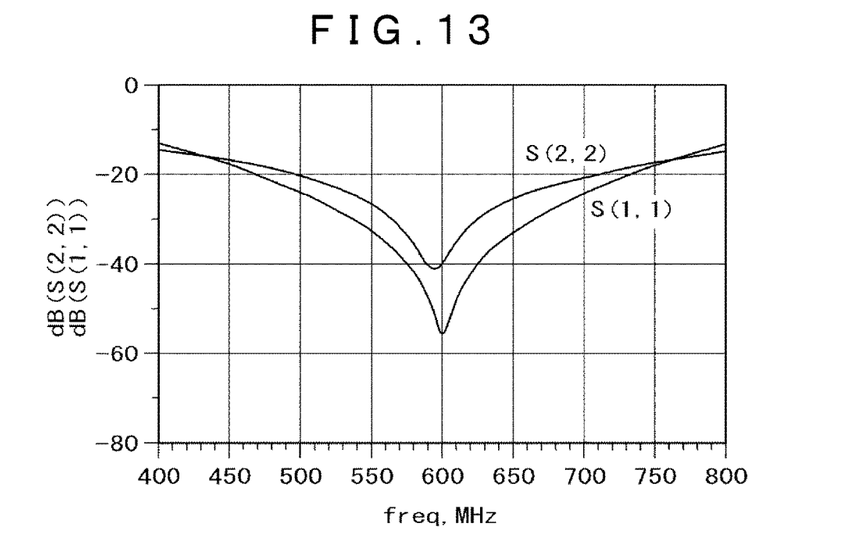
FIG. 13 is a diagram for illustrating the simulation result of the reflection characteristics of the Wilkinson combiner according to example 2.
Figure 14:
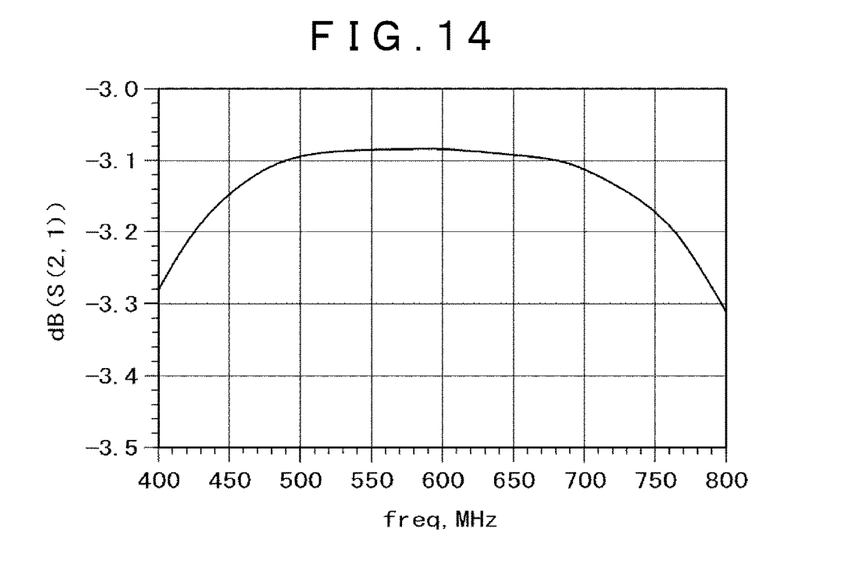
FIG. 14 is a diagram for illustrating the simulation result of transmission losses of the Wilkinson combiner according to example 2.
Figure 15:
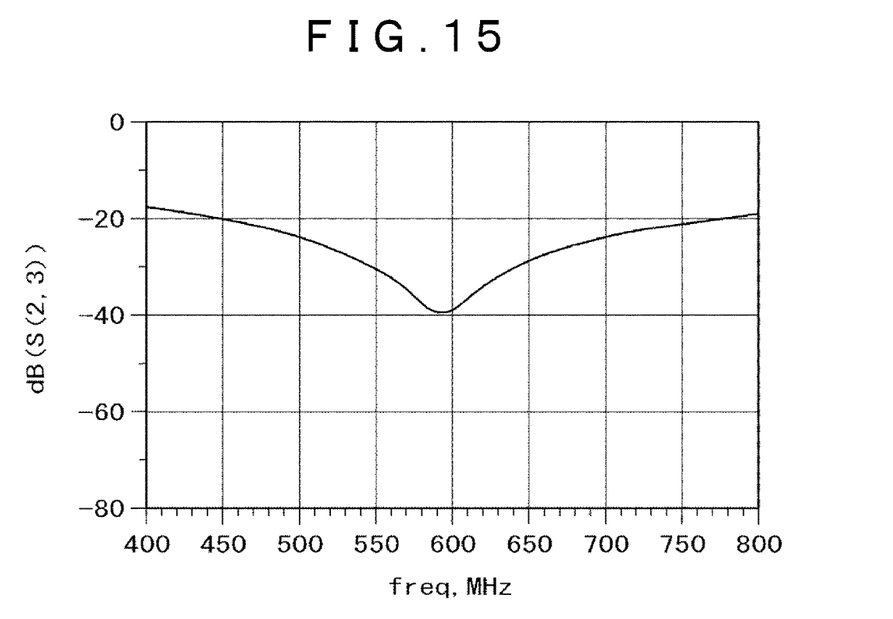
FIG. 15 is a diagram for illustrating the simulation result of the isolation characteristics of the Wilkinson combiner according to example 2.

A Wilkinson combiner according to example 2 will be described with reference to FIGS. 12 to 15. FIG. 12 is a diagram of the configuration of the Wilkinson combiner according to example 2. FIG. 13 is a diagram of the simulation result of the reflection characteristics of the Wilkinson combiner according to example 2. Note that, FIG. 13 shows the reflection characteristic (S (2, 2)) of the port PRT2. However, the characteristics viewed from the port PRT3 are also equivalent to the characteristics of the circuit viewed from the port PRT2, and these characteristics are theoretically matched with each other. Thus, in FIG. 13 for illustrating the simulation result, the reflection characteristic (S (3, 3)) of the port PRT3 is omitted, and the description is also omitted. FIG. 14 is a diagram of the simulation result of transmission losses of the Wilkinson combiner according to example 2. Note that, FIG. 14 shows the transmission loss (S (2, 1)) between the ports PRT2 and PRT1. However, the characteristics viewed from the port PRT3 are also equivalent to the characteristics of the circuit viewed from the port PRT2, and these characteristics are theoretically matched with each other. Thus, in FIG. 14 for illustrating the simulation result, the transmission loss (S (3, 1)) between the ports PRT3 and PRT1 is omitted, and the description is also omitted. FIG. 15 is a diagram of the simulation result of the isolation characteristics of the Wilkinson combiner according to example 2.

The Wilkinson combiner 30 according to example 2 has the same configuration as the configurations of the Wilkinson combiners 10 and 20 except an isolating unit 33. Note that, the matching circuits 11, 21, and 31 are provided as necessary similarly to example 1. In the Wilkinson combiner 20, a 100-ohm semi-rigid cable is used. However, the 100-ohm semi-rigid cable has a low normal rated power, and its availability is poor as well. Therefore, 50-ohm semi-rigid cables are used for the isolating unit 33 of the Wilkinson combiner 30 according to example 2, instead of a 100-ohm semi-rigid cable. In order to provide a circuit equivalent to the isolating unit 23, an impedance converter 334 that converts an impedance of 25 ohms into 50 ohms is inserted between the other ends of semi-rigid cables 331 and 332 and the terminator 233. The impedance converter 334 is a transmission line of one-quarter wavelength (600 MHz) with an impedance of 35.35 ohms.

As shown in FIG. 13, the reflection characteristic (S (1, 1)) of the port PRT1 in a band of 500 MHz is about −24 dB, S (1, 1) in a band of 600 MHz is about −55 dB, and S (1, 1) in a band of 700 MHz is about −24 dB. The reflection characteristic (S (2, 2)) of the port PRT2 in a band of 500 MHz is about −21 dB, S (2, 2) in a band of 600 MHz is about −40 dB, and S (2, 2) in a band of 700 MHz is about −21 dB. As described above, the reflection characteristics of the port PRT1 are equivalent to ones in the case of using an ideal resistor for the isolation resistor (FIG. 2), which are excellent. The reflection characteristics of the port PRT2 are the characteristics more excellent than in example 1, which are close to the characteristics in the case of using an ideal resistor.

As shown in FIG. 14, the transmission loss (S (2, 1)) between the ports PRT2 and PRT1 in a band of 500 MHz is about −3.1 dB, S (2, 1) in a band of 600 MHz is about −3.1 dB and S (2, 1) in a band of 700 MHz is about −3.1 dB. As described above, the transmission losses are equivalent to ones in the case of using an ideal resistor for the isolation resistor (FIG. 3).

As shown in FIG. 15, the isolation characteristic (S (2, 3)) between the ports PRT2 and PRT3 in a band of 500 MHz is about −24 dB, S (2, 3) in a band of 600 MHz is about −39 dB, and S (2, 3) in a band of 700 MHz is about −24 dB. As described above, the isolation characteristics are the characteristics more excellent than in example 1, which are close to the characteristics in the case of using an ideal resistor.

As described above, the Wilkinson combiner 30 has performances comparing favorably with the case of using an ideal resistor for the isolation resistor. With the use of 50-ohm semi-rigid cables instead of a 100-ohm semi-rigid cable, a semi-rigid cable of higher withstand power can be used. Thus, the Wilkinson combiner having a high withstand power at the isolating unit can be achieved.

Note that, in example 2, the impedance converter that converts an impedance of 25 ohms into 50 ohms is combined with the 50-ohm semi-rigid cables. However, a form may be possible in which another impedance converter is combined with semi-rigid cables with other impedances.

In examples 1 and 2, the semi-rigid cables are used. However, a balun circuit in another form may be used instead of semi-rigid cables. For example, a pattern balun circuit formed of a pattern on a circuit board may be used.

In examples 1 and 2, the Wilkinson combiners are described. However, examples 1 and 2 are also applicable to a Wilkinson divider. That is, in the configurations of the Wilkinson combiners 20 and 30, when a signal is inputted from the port PRT1, the combiner 12 operates as a divider, and the divided signals are outputted from the ports PRT2 and PRT3. Thus, the Wilkinson combiners 20 and 30 are allowed to function as Wilkinson dividers.

As described above, the invention made by the present inventor is described specifically based on the embodiments and the examples. However, it is without saying that the present invention is not limited to the foregoing embodiments and the examples, which can be variously modified and altered.

INDUSTRIAL APPLICABILITY

The present disclosure is applicable to a high power Wilkinson combiner and a Wilkinson divider.

REFERENCE SIGNS LIST 10, 20, 30: Wilkinson combiner
11: matching circuit
12: combiner
21, 31: matching circuit
22, 32: splitter
23, 23R, 33: isolating unit
231, 232: semi-rigid cable
233: terminator
331, 332: semi-rigid cable
334: impedance converter circuit

The invention claimed is:
1. A Wilkinson combiner comprising:
a first splitting unit that splits signals inputted from a first port;
a second splitting unit that splits signals inputted from a second port;
an isolating unit that connects one ends of the signals split at the first and second splitting units to each other; and
a combiner that connects other ends of the signals split at the first and second splitting units to each other and outputs a combined signal,
wherein the isolating unit comprises a first coaxial cable and a second coaxial cable,
an inner conductor at one end of the first coaxial cable is connected to the first splitting unit and an outer conductor is short-circuited, an inner conductor at one end of the second coaxial cable is connected to the second splitting unit and an outer conductor is short-circuited, the inner conductor at the other end of the first coaxial cable and the outer conductor at the other end of the second coaxial cable are connected, the inner conductor at the other end of the second coaxial cable and the outer conductor at the other end of the first coaxial cable are connected, and one of, a side on which the internal conductor at the other end of the first coaxial cable and the external conductor on the other end of the second coaxial cable are connected and a side on which the internal conductor at the other end of the second coaxial cable and the external conductor on the other end of the first coaxial cable are connected, is short-circuited and the other is terminated by a terminator.

2. The Wilkinson combiner according to claim 1,
wherein the terminator is terminated via an impedance converter.

3. The Wilkinson combiner according to claim 2,
wherein the first and second coaxial cables are configured using semi-rigid cable.

4. The Wilkinson combiner according to claim 1,
wherein the first and second coaxial cables are configured using a semi-rigid cable.

5. A Wilkinson divider comprising:
a divider that divides an inputted signal;
a first splitting unit that splits one signal divided at the divider;
a second splitting unit that splits the other signal divided at the divider; and
an isolating unit that connects one ends of the signals split at the first and second splitting units to each other, wherein the isolating unit comprises a first coaxial cable and a second coaxial cable, an inner conductor at one end of the first coaxial cable is connected to the first splitting unit and an outer conductor is short-circuited, an inner conductor at one end of the second coaxial cable is connected to the second splitting unit and an outer conductor is short-circuited, the inner conductor at the other end of the first coaxial cable and the outer conductor at the other end of the second coaxial cable are connected, the inner conductor at the other end of the second coaxial cable and the outer conductor at the other end of the first coaxial cable are connected, and one of, a side on which the internal conductor at the other end of the first coaxial cable and the external conductor on the other end of the second coaxial cable are connected and a side on which the internal conductor at the other end of the second coaxial cable and the external conductor on the other end of the first coaxial cable are connected, is short-circuited and the other is terminated by a terminator.

6. The Wilkinson divider according to claim 5,
wherein the terminator is terminated via an impedance converter.

7. The Wilkinson divider according to claim 6,
wherein the first and second coaxial cables are configured using a semi-rigid cable.

8. The Wilkinson divider according to claim 5,
wherein the first and second coaxial cables are configured using a semi-rigid cable.

* * * * *